United States Patent
Ahn et al.

(10) Patent No.: US 11,691,387 B2
(45) Date of Patent: Jul. 4, 2023

(54) LAMINATED ANODIC ALUMINUM OXIDE STRUCTURE, GUIDE PLATE OF PROBE CARD USING SAME, AND PROBE CARD HAVING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 154 days.

(21) Appl. No.: 17/232,029

(22) Filed: Apr. 15, 2021

(65) Prior Publication Data

US 2021/0331446 A1   Oct. 28, 2021

(30) Foreign Application Priority Data

Apr. 24, 2020 (KR) .................. 10-2020-0050095

(51) Int. Cl.
*B32B 15/04* (2006.01)
*B32B 15/20* (2006.01)
(Continued)

(52) U.S. Cl.
CPC ............ *B32B 15/043* (2013.01); *B32B 3/266* (2013.01); *B32B 15/20* (2013.01); *C25D 11/04* (2013.01);
(Continued)

(58) Field of Classification Search
CPC .............. H05K 1/0306; H05K 1/115; H05K 2201/09618; G01R 1/07378; G01R 1/07314; G01R 1/07357; G01R 1/07371; G01R 3/00; G01R 1/0735; G01R 1/07307; G01R 31/2863; G01R 31/2886; G01R 1/07342; G01R 1/073; G01R 31/2856; B32B 15/043; B32B 3/266; B32B 15/20; B32B 2255/06; B32B 2255/20; B32B 9/005; B32B 2307/7242; B32B 27/34; C25D 11/04; C25D 11/18; C25D 11/246;
(Continued)

(56) References Cited

U.S. PATENT DOCUMENTS

2004/0036493 A1* 2/2004 Miller ................ G01R 31/2889
324/754.14

FOREIGN PATENT DOCUMENTS

JP    H0693431 B2 * 11/1994
JP    H0936122 A  *  2/1997
(Continued)

OTHER PUBLICATIONS

Kato et al. "Photosensitive-polyimide based method for fabricating various neural electrode architectures", Frontiers in Neuroengineering, Jun. 2012 (Year: 2012).*

*Primary Examiner* — Alexander Satanovsky
*Assistant Examiner* — Asm Fakhruddin

(57) ABSTRACT

Proposed are a laminated anodic aluminum oxide structure in which a plurality of anodic aluminum oxide films are stacked, a guide plate of a probe card using the same, and a probe card having the same. More particularly, proposed are a laminated anodic aluminum oxide structure with a high degree of surface strength, a guide plate of a probe card using the same, and a probe card having the same.

7 Claims, 12 Drawing Sheets

(51) Int. Cl.
*B32B 3/26* (2006.01)
*G01R 1/073* (2006.01)
*C25D 11/04* (2006.01)

(52) U.S. Cl.
CPC ...... *G01R 1/07342* (2013.01); *B32B 2255/06* (2013.01); *B32B 2255/20* (2013.01)

(58) Field of Classification Search
CPC ... C25D 11/12; C25D 11/02; C04B 2237/343; C23C 28/048
See application file for complete search history.

(56) References Cited

FOREIGN PATENT DOCUMENTS

| | | | | |
|---|---|---|---|---|
| JP | H10121292 | A | * 5/1998 | |
| JP | 2009224146 | A | * 10/2009 | ........... G01R 1/0735 |
| JP | 2011181895 | A | * 9/2011 | ............. B23K 20/04 |
| JP | 5337341 | B2 | * 11/2013 | ............... G01R 3/00 |
| KR | 100664900 | B1 | 1/2007 | |
| KR | 101823527 | B1 | * 1/2018 | |

* cited by examiner

LAMINATED ANODIC ALUMINUM OXIDE STRUCTURE, GUIDE PLATE OF PROBE CARD USING SAME, AND PROBE CARD HAVING SAME

CROSS REFERENCE TO RELATED APPLICATION

The present application claims priority to Korean Patent Application No. 10-2020-0050095, filed Apr. 24, 2020, the entire contents of which is incorporated herein for all purposes by this reference.

BACKGROUND OF THE INVENTION

Field of the Invention

The present disclosure relates generally to a laminated anodic aluminum oxide structure in which a plurality of anodic aluminum oxide films are stacked, a guide plate of a probe card using the same, and a probe card having the same.

Description of the Related Art

An anodic aluminum oxide film material may have a small degree of thermal deformation under a high-temperature atmosphere. Therefore, the anodic aluminum oxide film can be advantageously used in industrial fields including semiconductor or display fields requiring a high-temperature process atmosphere.

The anodic aluminum oxide film may be manufactured in the form of a thin plate and may constitute various components used in industrial fields including semiconductor or display fields. The thinning of the anodic aluminum oxide film may be to improve performance efficiency in a specific field.

However, the thin anodic aluminum oxide film has a disadvantage in that its strength is low due to its thickness. Therefore, it may be difficult to use the anodic aluminum oxide film as a single sheet. For example, when the anodic aluminum oxide film is provided as a single sheet on a specific component, this may cause a problem of reducing durability of the entire component due to low strength.

The foregoing is intended merely to aid in the understanding of the background of the present disclosure, and is not intended to mean that the present disclosure falls within the purview of the related art that is already known to those skilled in the art.

DOCUMENTS OF RELATED ART (Patent document 1) Korean Patent No. 10-0664900

SUMMARY OF THE INVENTION

Accordingly, the present disclosure has been made keeping in mind the above problems occurring in the related art, and an objective of the present disclosure is to provide a laminated anodic aluminum oxide structure having improved durability.

Another objective of the present disclosure is to provide a guide plate of a probe card using a laminated anodic aluminum oxide structure having improved durability.

Still another objective of the present disclosure is to provide a probe card having a guide plate using a laminated anodic aluminum oxide structure having improved durability.

In order to achieve the above objectives, according to one aspect of the present disclosure, there is provided a laminated anodic aluminum oxide structure, including: a plurality of anodic aluminum oxide sheets; and a junction layer provided between the anodic aluminum oxide sheets to join the anodic aluminum oxide sheets to each other, wherein the laminated anodic aluminum oxide structure may have surfaces each configured as a barrier layer of each of the plurality of anodic aluminum oxide sheets.

Furthermore, the junction layer may be a photosensitive material.

Furthermore, each of the anodic aluminum oxide sheets may include a through-hole.

Furthermore, the anodic aluminum oxide sheets may include: a surface-side anodic aluminum oxide sheet forming each of the surfaces of the laminated anodic aluminum oxide structure; and an inner-side anodic aluminum oxide sheet provided between the respective surface-side anodic aluminum oxide sheets, wherein each of the surface-side anodic aluminum oxide sheets may include a porous layer having pores and a barrier layer having no pores, and the inner-side anodic aluminum oxide sheet may include only a porous layer having pores.

Furthermore, the anodic aluminum oxide sheets may include: a surface-side anodic aluminum oxide sheet forming each of the surfaces of the laminated anodic aluminum oxide structure; and an inner-side anodic aluminum oxide sheet provided between the respective surface-side anodic aluminum oxide sheets, wherein the inner-side anodic aluminum oxide sheet may include a porous layer having pores and a barrier layer having no pores.

According to another aspect of the present disclosure, there is provided a guide plate of a probe card, the guide plate using a laminated anodic aluminum oxide structure having a guide hole for allowing insertion of a probe of a probe card, wherein the laminated anodic aluminum oxide structure may include: a plurality of anodic aluminum oxide sheets; and a junction layer provided between the anodic aluminum oxide sheets to join the anodic aluminum oxide sheets to each other, and the laminated anodic aluminum oxide structure may have surfaces each configured as a barrier layer of each of the plurality of anodic aluminum oxide sheets.

According to still another aspect of the present disclosure, there is provided a probe card, including: a space transformer having a probe connection pad electrically connected to each of a plurality of probes; and a probe head provided below the space transformer, and including a laminated anodic aluminum oxide structure in which a guide hole for allowing each of the probes is formed, wherein the laminated anodic aluminum oxide structure may include: a plurality of anodic aluminum oxide sheets; and a junction layer provided between the anodic aluminum oxide sheets to join the anodic aluminum oxide sheets to each other, and the laminated anodic aluminum oxide structure may have surfaces each configured as a barrier layer of each of the plurality of anodic aluminum oxide sheets.

According to the laminated anodic aluminum oxide structure, the guide plate of the probe card using the same, and the probe card having the same, it is possible to perform a high-temperature process more effectively by using the laminated anodic aluminum oxide structure that has excellent mechanical strength by its laminated structure and is prevented from experiencing warpage deformation by its vertically symmetric density.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
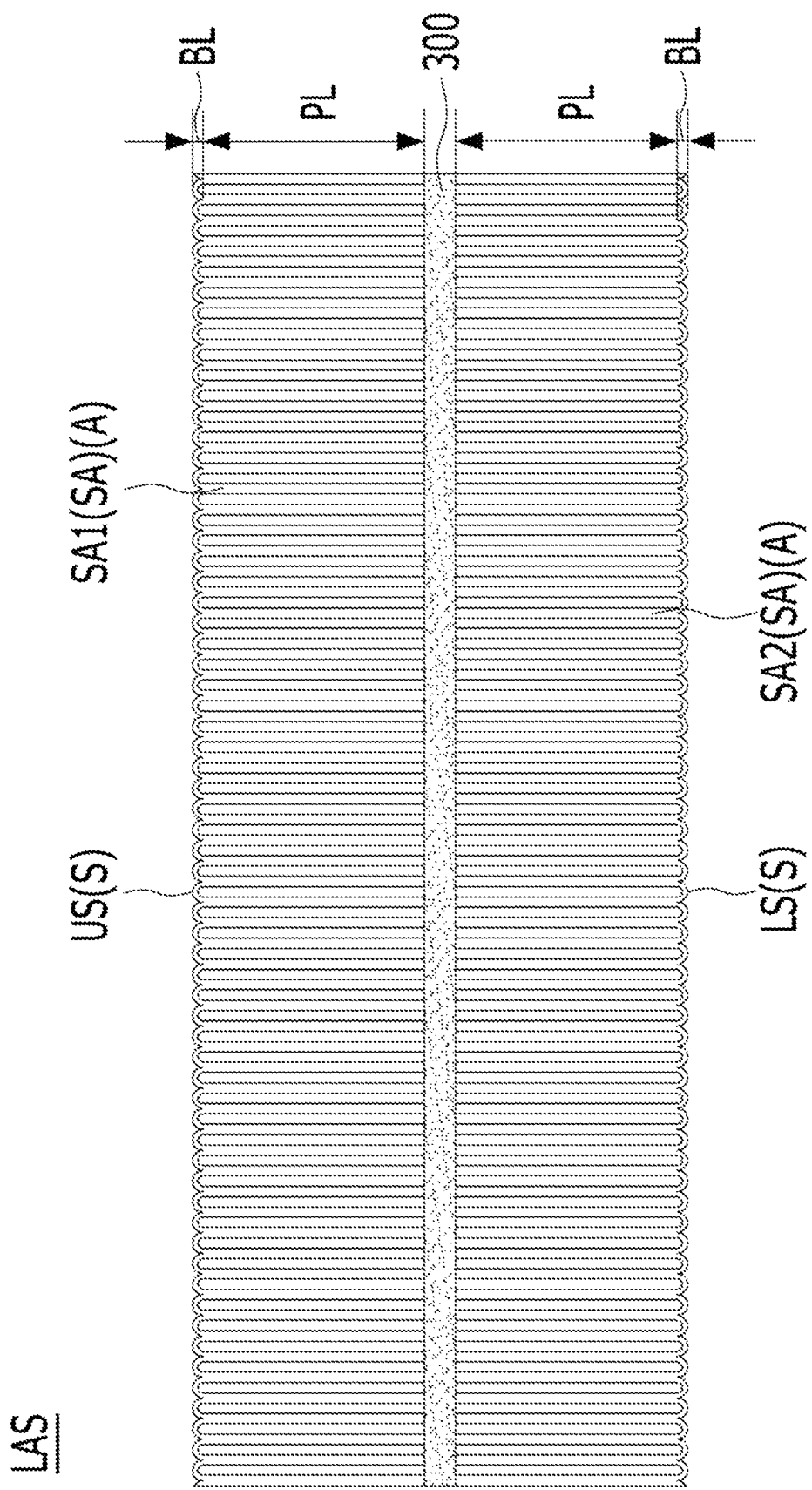
FIG. 1 is a view illustrating a laminated anodic aluminum oxide structure according to a first exemplary embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses of films and regions and diameters of holes in the figures may be exaggerated. Therefore, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. In addition, the configuration and operation already described in other embodiments will be omitted for convenience.

Hereinafter, exemplary embodiments of the present disclosure will be described in detail with reference to the accompanying drawings.

Laminated Anodic Aluminum Oxide Structure According to First Exemplary Embodiment of the Present Disclosure FIG. 1 is a view illustrating a laminated anodic aluminum oxide structure LAS according to a first exemplary embodiment of the present disclosure.

The laminated anodic aluminum oxide structure LAS according to the first exemplary embodiment of the present disclosure may be composed of at least two anodic aluminum oxide sheets A, and may be composed of i) an odd number of anodic aluminum oxide sheets A and ii) an even number of anodic aluminum oxide sheets A. In this case, the laminated anodic aluminum oxide structure LAS according to the first exemplary embodiment of the present disclosure may have a vertical symmetry structure in which upper and lower portions thereof are vertically symmetrical with respect to a cross-sectional center line C regardless of the number of the anodic aluminum oxide sheets A. However, the number of the anodic aluminum oxide sheets A constituting the laminated anodic aluminum oxide structure LAS according to the first exemplary embodiment of the present disclosure may be to explain various structures in implementing the laminated anodic aluminum oxide structure LAS.

The laminated anodic aluminum oxide structure LAS according to the first exemplary embodiment of the present disclosure may include a plurality of anodic aluminum oxide sheets A, and a junction layer 300 provided between the anodic aluminum oxide sheets A to join the anodic aluminum oxide sheets A to each other.

In this case, each of the anodic aluminum oxide sheets A may be made of an anodic aluminum oxide film including a porous layer PL having pores P and a barrier layer BL having no pores P. The anodic aluminum oxide film refers to a film formed by anodizing a metal that is a base material, and pores P refer to pores formed in the anodic aluminum oxide film during the process of forming the anodic aluminum oxide film by anodizing the metal.

Each of the anodic aluminum oxide sheets A may be manufactured by the following process.

First, in case where the metal as the base material is aluminum (Al) or an aluminum alloy, the anodization of the base material forms the anodic aluminum oxide film 101 consisting of anodized aluminum oxide ($Al_2O_3$) on a surface of the base material. The anodic aluminum oxide film has the barrier layer BL in which no pores P are formed and the porous layer PL in which pores P are formed.

The barrier layer BL is positioned on the base material, and the porous layer PL is positioned on the barrier layer BL. Specifically, when anodizing the base material, the barrier layer BL is first formed, and the porous layer PL is formed when the barrier layer BL achieves a predetermined thickness.

The thickness of the barrier layer BL may be in a range of equal to or greater than several tens of nm to equal to or less than several µm, preferably equal to or greater than 100 nm to equal to or less than 1 µm.

The thickness of the porous layer PL may be in a range of equal to or greater than several tens of nm to equal to or less than several hundred of µm.

The diameter of each of the pores P included in the porous layer PL may be in a range of equal to or greater than several nm to equal to or less than several hundred of nm.

Then, in the state in which the anodic aluminum oxide film having the barrier layer BL and the porous layer PL is formed on the base material, the base material may be removed. By this process, only the anodic aluminum oxide film consisting of anodized aluminum oxide ($Al_2O_3$) remains.

The anodic aluminum oxide film may have a coefficient of thermal expansion similar to that of a wafer W. Therefore, the anodic aluminum oxide film may have a small degree of thermal deformation due to heat under a high-temperature atmosphere. Since the laminated anodic aluminum oxide structure LAS according to the first exemplary embodiment of the present disclosure may be composed of the anodic aluminum oxide sheets A each made of the above anodic aluminum oxide film, there is an advantage of undergoing a small degree of thermal deformation under a high-temperature environment.

Each of the anodic aluminum oxide sheets A may have a structure in which the barrier layer BL is positioned under the porous layer PL, or a structure in which the barrier layer BL is positioned above the porous layer PL.

The anodic aluminum oxide sheet A may have a structure in which the porous layer PL is positioned above or below the barrier layer BL, so that upper and lower surfaces thereof are asymmetrical.

Depending on its stacked position, each of the anodic aluminum oxide sheets A may have a structure in which the porous layer PL is positioned above the barrier layer BL or the porous layer PL is positioned below the barrier layer BL.

Specifically, the laminated anodic aluminum oxide structure LAS according to the first exemplary embodiment of the present disclosure may be configured so that each of surfaces S thereof including upper and lower surfaces US and LS is configured as the barrier layer BL of each of the respective anodic aluminum oxide films. In this case, the anodic aluminum oxide sheets A may be configured so that the upper and lower surfaces US and LS of the laminated anodic aluminum oxide structure LAS according to the first exemplary embodiment of the present disclosure are configured as the respective barrier layers BL.

An anodic aluminum oxide sheet A forming the upper surface US may have a structure in which the barrier layer BL is positioned on the porous layer PL. In addition, an anodic aluminum oxide sheet A forming the lower surface LS may have a structure in which the barrier layer BL is positioned under the porous layer PL.

The porous layer PL and the barrier layer BL may have a difference in density due to the presence or absence of the pores P. The barrier layer BL is a region where no pores P exist and thus may have a relatively higher density than the porous layer PL.

The laminated anodic aluminum oxide structure LAS according to the first exemplary embodiment of the present disclosure may be configured so that the at least two anodic aluminum oxide sheets A are stacked, and the surfaces S are configured as the barrier layers BL of the anodic aluminum oxide films. Therefore, since the surfaces S may be configured as the barrier layers BL, the laminated anodic aluminum oxide structure LAS according to the first exemplary embodiment of the present disclosure may have excellent surface strength.

As an example, when two anodic aluminum oxide sheets A are provided to constitute the laminated anodic aluminum oxide structure LAS according to the first exemplary embodiment of the present disclosure, preferably, the anodic aluminum oxide sheets A may be only composed of surface-side anodic aluminum oxide sheets SA. The surface-side anodic aluminum oxide sheets SA may include an upper surface-side anodic aluminum oxide sheet SA1 forming the upper surface US and a lower surface-side anodic aluminum oxide sheet SA2 forming the lower surface LS. Therefore, when composed of the two anodic aluminum oxide sheets A, the laminated anodic aluminum oxide structure LAS according to the first exemplary embodiment of the present disclosure may be composed of the upper surface-side anodic aluminum oxide sheet SA1 and the lower surface-side anodic aluminum oxide sheet SA2.

The surface-side anodic aluminum oxide sheets SA may be configured so that the upper and lower surfaces US and LS of the laminated anodic aluminum oxide structure LAS according to the first exemplary embodiment of the present disclosure are configured as the barrier layers BL. Specifically, the upper surface-side anodic aluminum oxide sheet SA1 may have a structure in which the porous layer PL is positioned under the barrier layer BL. The lower surface-side anodic aluminum oxide sheet SA2 may have a structure in which the porous layer PL is positioned on the barrier layer BL.

Each of the surface-side anodic aluminum oxide sheets SA may include the porous layer PL having pores P and the barrier layer BL having no pores P, thereby realizing a structure in which the surfaces S of the laminated anodic aluminum oxide structure LAS according to the first exemplary embodiment of the present disclosure are configured as the barrier layers BL of the anodic aluminum oxide films. With such a structure, upper and lower portions of the laminated anodic aluminum oxide structure LAS may be symmetrical in density. As a result, warpage deformation under a high-temperature environment may be prevented.

The plurality of anodic aluminum oxide sheets A may be composed of the surface-side anodic aluminum oxide sheets SA forming the surfaces S of the laminated anodic aluminum oxide structure LAS according to the first exemplary embodiment of the present disclosure, and an inner-side anodic aluminum oxide sheet IA provided between the surface-side anodic aluminum oxide sheets SA.

i) With Respect to Laminated Anodic Aluminum Oxide Structure LAS According to First Exemplary Embodiment of the Present Disclosure Composed of Odd Number of Anodic Aluminum Oxide Sheets A A laminated anodic aluminum oxide structure LAS according to the first exemplary embodiment of the present disclosure may have a structure in which at least three anodic aluminum oxide sheets A are stacked. In this case, the laminated anodic aluminum oxide structure LAS according to the first exemplary embodiment of the present disclosure may include the anodic aluminum oxide sheets A composed of surface-side anodic aluminum oxide sheets SA and an inner-side anodic aluminum oxide sheet IA.

Figure 2:
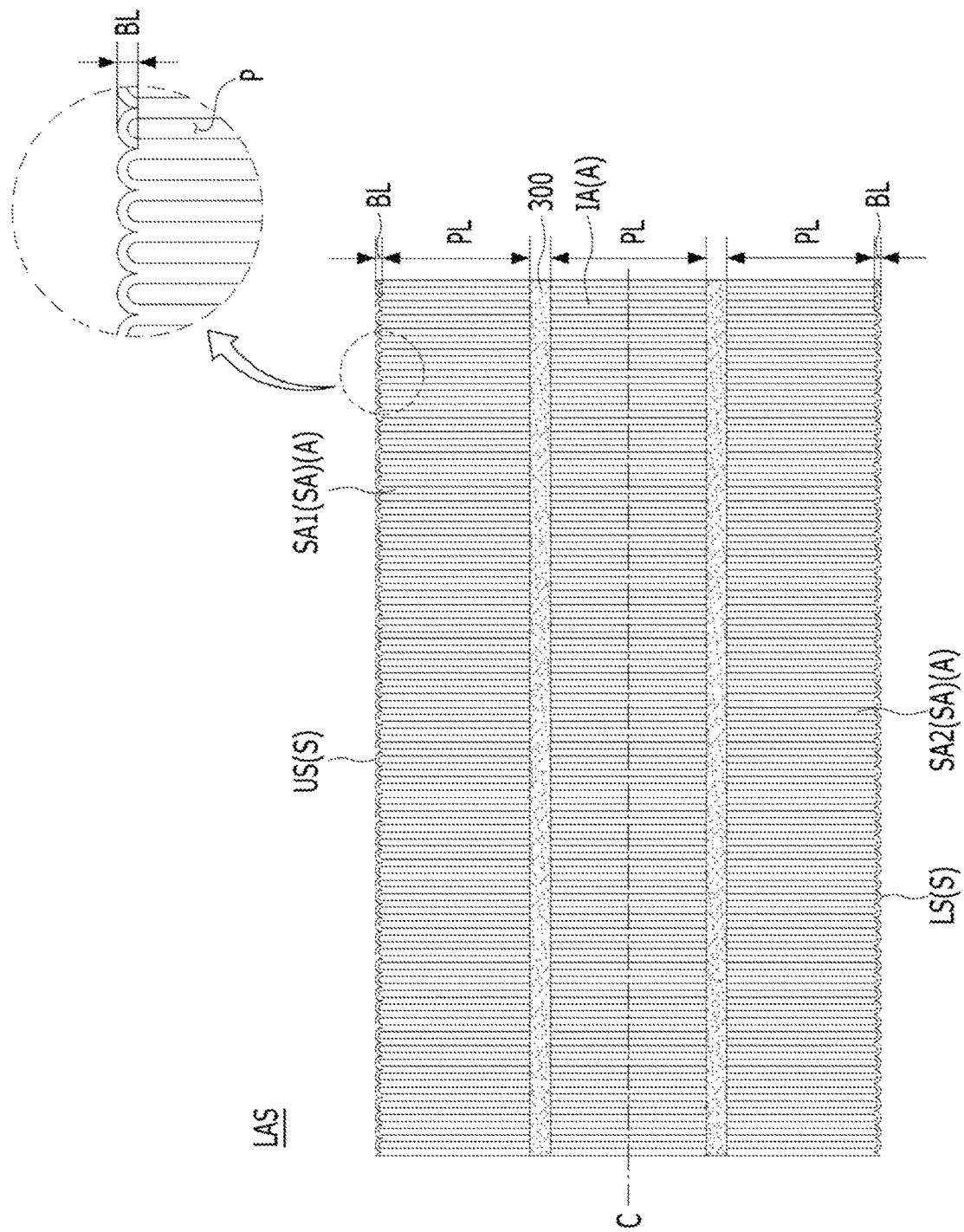
FIG. 2 is a view illustrating a laminated anodic aluminum oxide structure according to the first exemplary embodiment of the present disclosure, which is composed of an odd number of anodic aluminum oxide sheets.

FIG. 2 is a view illustrating a laminated anodic aluminum oxide structure according to the first exemplary embodiment of the present disclosure, which is composed of an odd number of anodic aluminum oxide sheets.

Specifically, as illustrated in FIG. 2, the laminated anodic aluminum oxide structure LAS according to the first exemplary embodiment of the present disclosure may have a structure in which three anodic aluminum oxide sheets A are stacked. In this case, surfaces S of the laminated anodic aluminum oxide structure LAS according to the first exemplary embodiment of the present disclosure may be formed by the surface-side anodic aluminum oxide sheets SA. By the surface-side anodic aluminum oxide sheets SA, each of the surfaces S of the laminated anodic aluminum oxide structure LAS according to the first preferred embodiment of the present disclosure may be configured as a barrier layer BL of an anodic aluminum oxide film.

The inner-side anodic aluminum oxide sheet IA may be provided between the surface-side anodic aluminum oxide sheets SA. The inner-side anodic aluminum oxide sheet IA may include only a porous layer PL having pores P.

As illustrated in FIG. 2, the laminated anodic aluminum oxide structure LAS according to the first exemplary embodiment of the present disclosure may have a vertical symmetry structure in which upper and lower portions thereof are vertically symmetrical with respect to a cross-sectional center line C. Specifically, the laminated anodic aluminum oxide structure LAS according to the first exemplary embodiment of the present disclosure may be configured so that an upper surface US is configured as the barrier layer BL of the anodic aluminum oxide film by an upper surface-side anodic aluminum oxide sheet SA1, and a lower surface LS is configured as the barrier layer BL of the anodic aluminum oxide film by a lower surface-side anodic aluminum oxide sheet SA2. In addition, an inside of the laminated anodic aluminum oxide structure LAS may be configured as only the porous layer PL by the inner-side anodic aluminum oxide sheet IA. Therefore, the laminated anodic aluminum oxide structure LAS according to the first exemplary embodiment of the present disclosure may have a vertical symmetry structure in which the surfaces S are configured as the barrier layers BL of the anodic aluminum oxide films so as to be vertically symmetrical with respect to a horizontal center line, which is the cross-sectional center line C illustrated in FIG. 2. The barrier layers BL forming the surfaces S may improve surface density of the laminated anodic aluminum oxide structure LAS according to the first exemplary embodiment of the present disclosure. In addition, the vertical symmetry structure may be prevented from experiencing warpage deformation due to heat under a high-temperature environment (e.g., a burn-in test during a semiconductor or display process).

As illustrated in FIG. 2, the anodic aluminum oxide sheets A may be joined to each other by a junction layer 300 provided therebetween. The junction layer 300 may be a photosensitive material, and may be a dry film photoresist (DFR) as an example. When the junction layer 300 is made of a photosensitive material, as will be described later, a through-hole H may be easily formed in the anodic aluminum oxide sheets A by using the junction layer 300. In addition, the junction layer 300 may be configured to have joining properties for the purpose of performing a joining function of joining the anodic aluminum oxide sheets A to each other. Therefore, the junction layer 300 may simultaneously have both the photosensitive properties and joining properties.

In addition, the junction layer 300 may be an epoxy, polyimide (PI), or acrylate-based photoresist capable of lithography. As a more specific example, the photoresist capable of lithography may be SU-8, which is an epoxy-based resist in which eight epoxy groups are included in a single molecule.

Meanwhile, the junction layer 300 may be a thermosetting resin. In this case, examples of the thermosetting resin may include polyimide resin, polyquinoline resin, polyamideimide resin, epoxy resin, polyphenylene ether resin, fluororesin, and the like.

The laminated anodic aluminum oxide structure LAS according to the first exemplary embodiment of the present disclosure may be provided with an additional configuration depending on its function.

Figure 3:
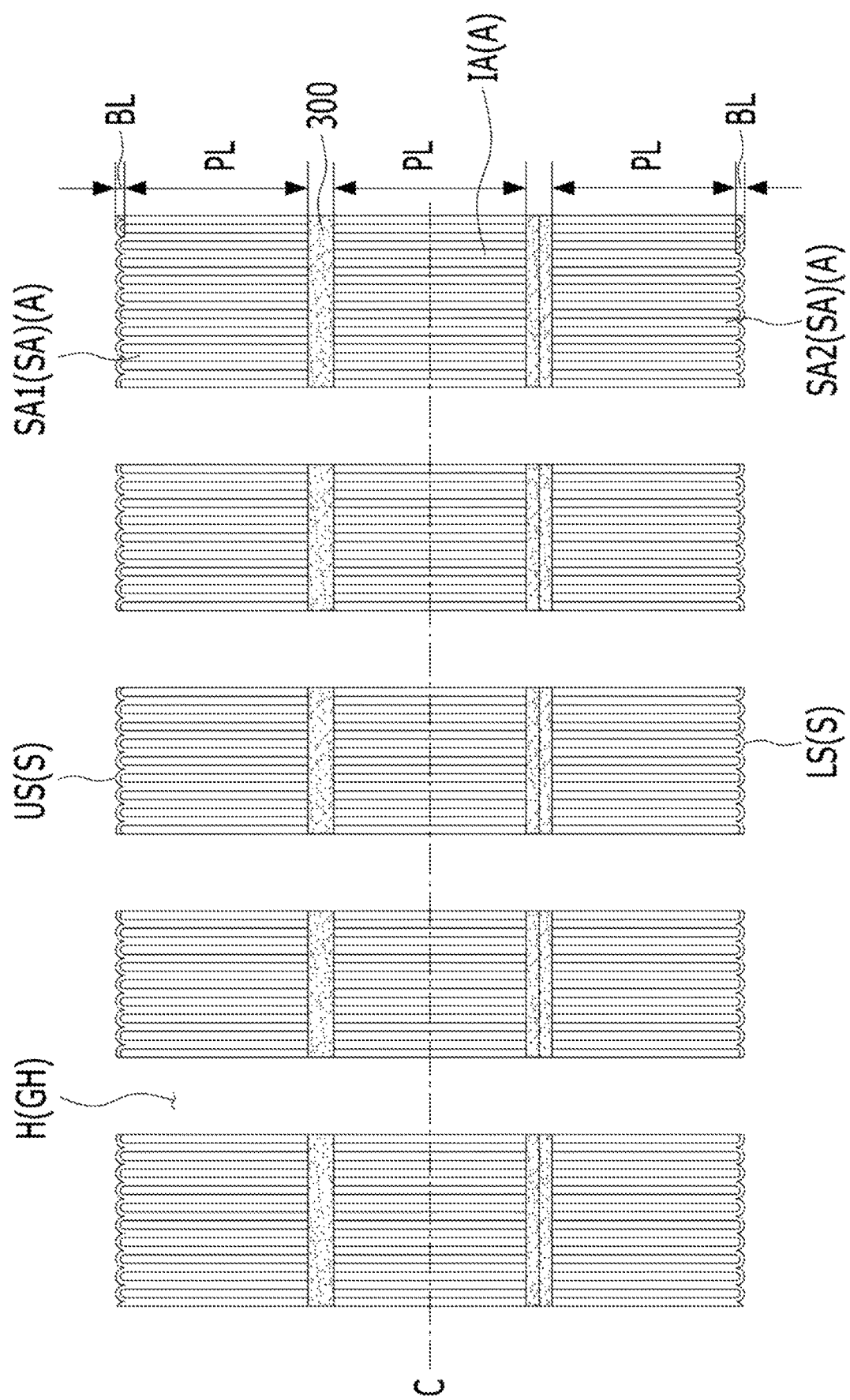
FIGS. 3, 4A, and 4B are views illustrating modified examples of the laminated anodic aluminum oxide structure according to the first exemplary embodiment of the present disclosure, which is composed of the odd number of anodic aluminum oxide sheets.

Specifically, as illustrated in FIG. 3, the laminated anodic aluminum oxide structure LAS according to the first exemplary embodiment of the present disclosure may be configured so that a through-hole H is provided in the anodic aluminum oxide sheets A. In this case, the through-hole H may be provided in each of the anodic aluminum oxide sheets A constituting the laminated anodic aluminum oxide structure LAS according to the first exemplary embodiment of the present disclosure, and the respective through-holes H may be provided at positions corresponding to each other. Therefore, the laminated anodic aluminum oxide structure LAS according to the first exemplary embodiment of the present disclosure may have the through-holes H passing therethrough from top to bottom.

In the laminated anodic aluminum oxide structure LAS according to the first exemplary embodiment of the present disclosure, the junction layer 300 of a photosensitive material may facilitate provision of the through-holes H.

Specifically, the laminated anodic aluminum oxide structure LAS according to the first exemplary embodiment of the present disclosure may be configured so that the junction layer 300 of a photosensitive material is provided on at least a surface of each of the anodic aluminum oxide sheets A constituting the laminated anodic aluminum oxide structure LAS. At least a portion of the photosensitive material may be patterned by a photo process. Then, each of the anodic aluminum oxide sheets A may be etched through a region from which the photosensitive material has been removed by patterning. When an anodic aluminum oxide film of the anodic aluminum oxide sheet A is subjected to wet etching with etchant, a through-hole H having a vertical inner wall may be formed. The through-hole H may be formed in the same shape and size as those of the region from which the junction layer 300 of the photosensitive material has been removed by patterning. Therefore, the anodic aluminum oxide sheet A may have a fine size and pitch through-hole H. The laminated anodic aluminum oxide structure LAS according to the first exemplary embodiment of the present disclosure may have a structure in which the anodic aluminum oxide sheets A having the respective through-holes H are joined to each other by the respective junction layers 300 that simultaneously possess photosensitive properties and joining properties.

In case where the laminated anodic aluminum oxide structure LAS according to the first exemplary embodiment of the present disclosure is provided as a configuration of a guide plate GP of a probe card 1, the through-holes H may function as guide-holes GH for allowing insertion of a probe 7.

Meanwhile, the through-holes H may function as conduits for allowing passage of fluid. In this case, the laminated anodic aluminum oxide structure LAS functions to insulate the fluid passing through the through-holes H from the surrounding environment.

Meanwhile, the through-holes H may function as conduits for allowing passage of solid. The solid passing through the through-holes H may be, for example, a particle having a specific size. In this case, the through-holes H may function as filters for filtering the particle. As another example, the solid passing through the through-holes H may be a bulk material. The bulk material may be the probe 70 as an example. In this case, the through-holes H may function as the guide holes GH for allowing insertion of the probe 70.

As illustrated in FIGS. 2 and 3, when the inner-side anodic aluminum oxide sheet IA is composed of only the porous layer PL, the laminated anodic aluminum oxide structure LAS according to the first exemplary embodiment of the present disclosure may have a structure in which upper and lower portions thereof are vertically entirely symmetrical with respect to the cross-sectional center line C.

Therefore, the laminated anodic aluminum oxide structure LAS according to the first exemplary embodiment of the present disclosure may have a structure in which the surfaces S are configured as the barrier layers BL of the anodic aluminum oxide films so as to be vertically symmetrical with respect to the cross-sectional center line C, and the anodic aluminum oxide sheets A are entirely vertically symmetrical with respect to the cross-sectional center line C. When having such a structure in which not only the surfaces S, but also the entire upper and lower portions thereof are vertically symmetrical with respect to the cross-sectional center line C, the laminated anodic aluminum oxide structure LAS according to the first exemplary embodiment of the present disclosure may have a symmetric density vertically, thus exhibiting a more excellent effect in terms of prevention of warpage deformation due to high temperature heat.

Figure 4A:
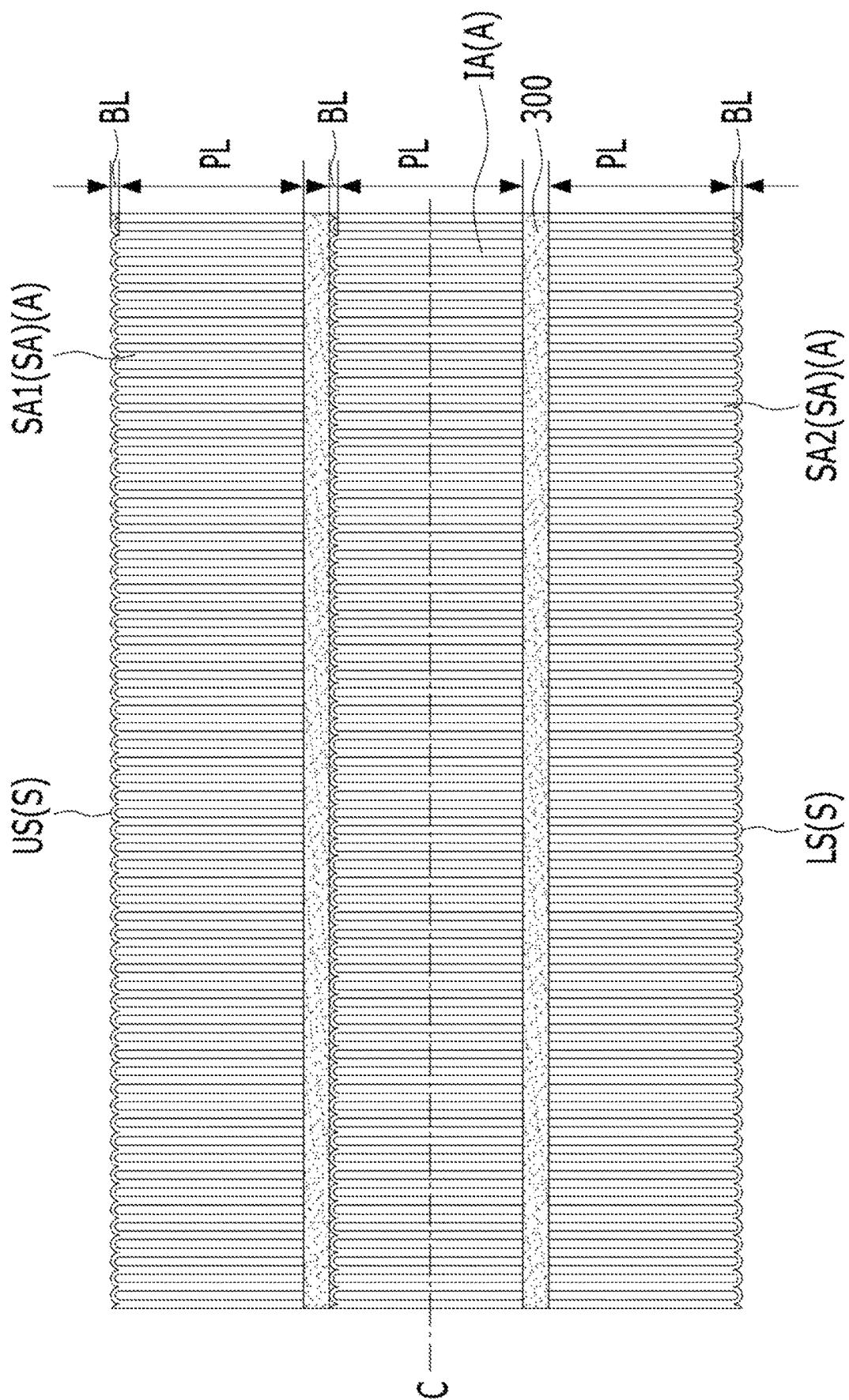
Figure 4B:
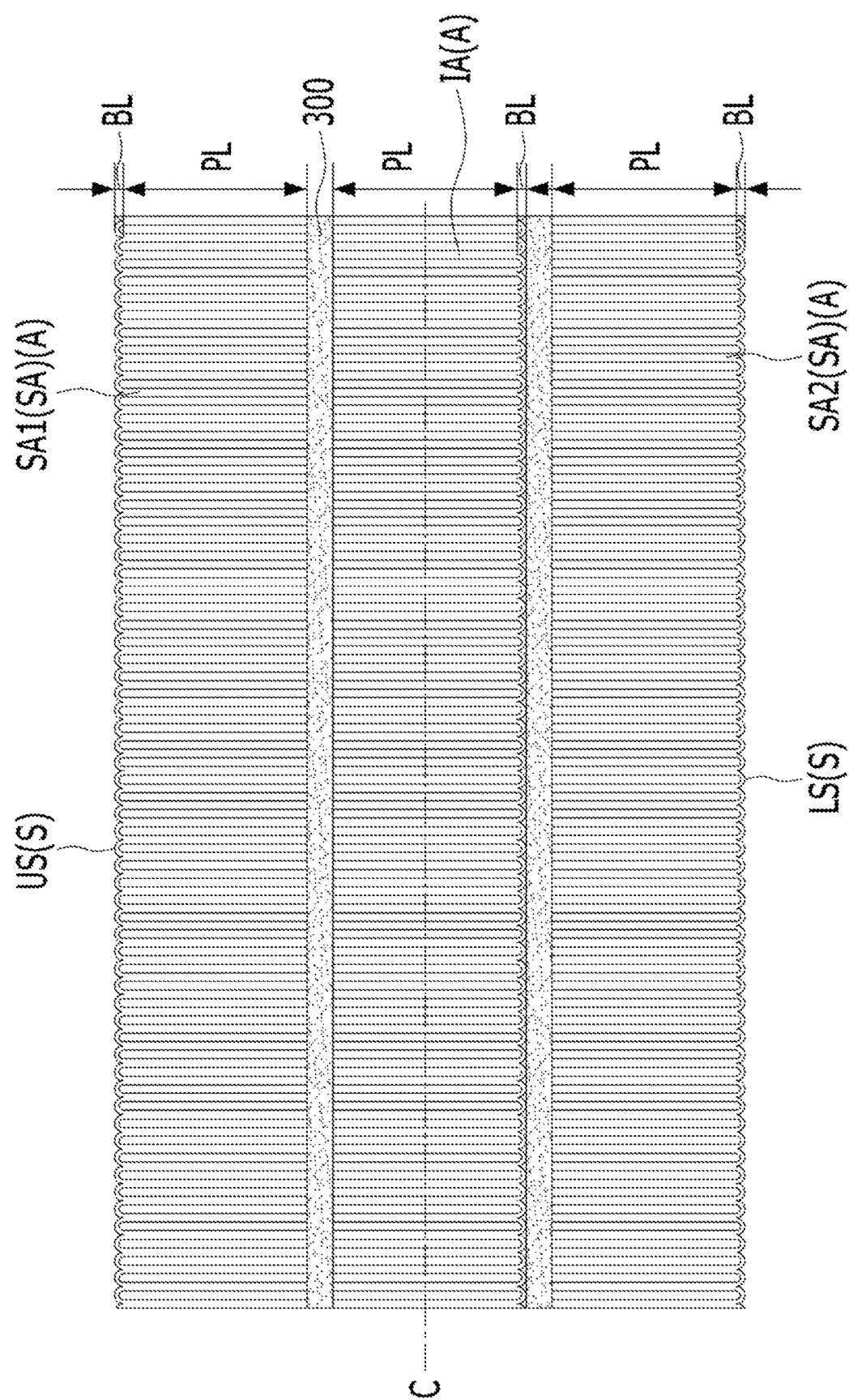

FIGS. 4A and 4B are views illustrating modified examples of the laminated anodic aluminum oxide structure LAS according to the first exemplary embodiment of the present disclosure, which is composed of an odd number (e.g., three) of anodic aluminum oxide sheets A. The modified examples differ from the laminated anodic aluminum oxide structure LAS according to the first exemplary embodiment of the present disclosure in terms of the structure of an inner-side anodic aluminum oxide sheet IA. In the modified examples, since all configurations except for this remain the same, characteristic configurations will be mainly described.

As illustrated in FIGS. 4A and 4B, the inner-side anodic aluminum oxide sheet IA may include a porous layer PL having pores P and a barrier layer BL having no pores P. As illustrated in FIG. 4A, the inner-side anodic aluminum oxide sheet IA may be provided between surface-side anodic aluminum oxide sheets SA, with the barrier layer BL positioned on the porous layer PL. On the contrary, the inner-side anodic aluminum oxide sheet IA may be provided between the surface-side anodic aluminum oxide sheets SA, with the barrier layer BL positioned under the porous layer PL.

Although FIGS. 4A and 4B illustrate the modified examples of the laminated anodic aluminum oxide structure LAS according to the first exemplary embodiment of the present disclosure, which is composed of the odd number of anodic aluminum oxide sheets A composed of two surface-side anodic aluminum oxide sheets SA and one inner-side anodic aluminum oxide sheet IA therebetween, the number of the odd number of anodic aluminum oxide sheets A constituting the laminated anodic aluminum oxide structure LAS according to the first exemplary embodiment of the present disclosure is not limited thereto.

When the laminated anodic aluminum oxide structure LAS according to the first exemplary embodiment of the present disclosure is composed of the odd number of anodic aluminum oxide sheets A, an odd number of inner-side anodic aluminum oxide sheets IA may be provided between the surface-side anodic aluminum oxide sheets SA forming the surfaces S.

The surfaces S may be configured as the barrier layers BL of the anodic aluminum oxide films by the surface-side anodic aluminum oxide sheets SA regardless of the structure of the inner-side anodic aluminum oxide sheet IA, so that the laminated anodic aluminum oxide structure LAS according to the first exemplary embodiment of the present disclosure may exhibit excellent surface strength by the barrier layers BL.

In the modified examples, a through-hole H may be provided in each of the anodic aluminum oxide sheets A. Therefore, as in case of the laminated anodic aluminum oxide structure LAS according to the first exemplary embodiment of the present disclosure having above-described through-hole H, the modified examples may function as guide plates GP of a probe card 1.

ii) With Respect to Laminated Anodic Aluminum Oxide Structure LAS According to First Exemplary Embodiment of the Present Disclosure Composed of Even Number of Anodic Aluminum Oxide Sheets A A laminated anodic aluminum oxide structure LAS according to the first exemplary embodiment of the present disclosure may be composed of two surface-side anodic aluminum oxide sheets SA forming surfaces S, and an even number of inner-side anodic aluminum oxide sheets IA provided therebetween. Therefore, the laminated anodic aluminum oxide structure LAS according to the first exemplary embodiment of the present disclosure may have a structure in which an even number of anodic aluminum oxide sheets A are stacked by being joined to each other by a junction layer 300.

The laminated anodic aluminum oxide structure LAS according to the first exemplary embodiment of the present disclosure composed of the even number of anodic aluminum oxide sheets A differs from the laminated anodic aluminum oxide structure LAS according to the first exemplary embodiment of the present disclosure composed of the odd number of anodic aluminum oxide sheets A in terms of the number of the anodic aluminum oxide sheets A. More specifically, there is a difference from the laminated anodic aluminum oxide structure LAS according to the first exemplary embodiment of the present disclosure composed of the odd number of anodic aluminum oxide sheets A in terms of the number of inner-side anodic aluminum oxide sheets IA. Therefore, in the following description with reference to FIGS. 5A to 6B, only characteristic configurations will be mainly described, and descriptions of the same configurations will be omitted.

FIGS. 5A, 5B, 5C, 6A, and 6B are views illustrating various embodiments of the laminated anodic aluminum oxide structure LAS according to the first exemplary embodiment of the present disclosure, which is composed of the even number of anodic aluminum oxide sheets A. Although FIGS. 5A, 5B, 5C, 6A, and 6B illustrate that the laminated anodic aluminum oxide structure LAS according to the first exemplary embodiment of the present disclosure is composed of four anodic aluminum oxide sheets A, the number of the even number of anodic aluminum oxide sheets A constituting the laminated anodic aluminum oxide structure LAS according to the first exemplary embodiment of the present disclosure is not limited thereto.

Figure 5A:
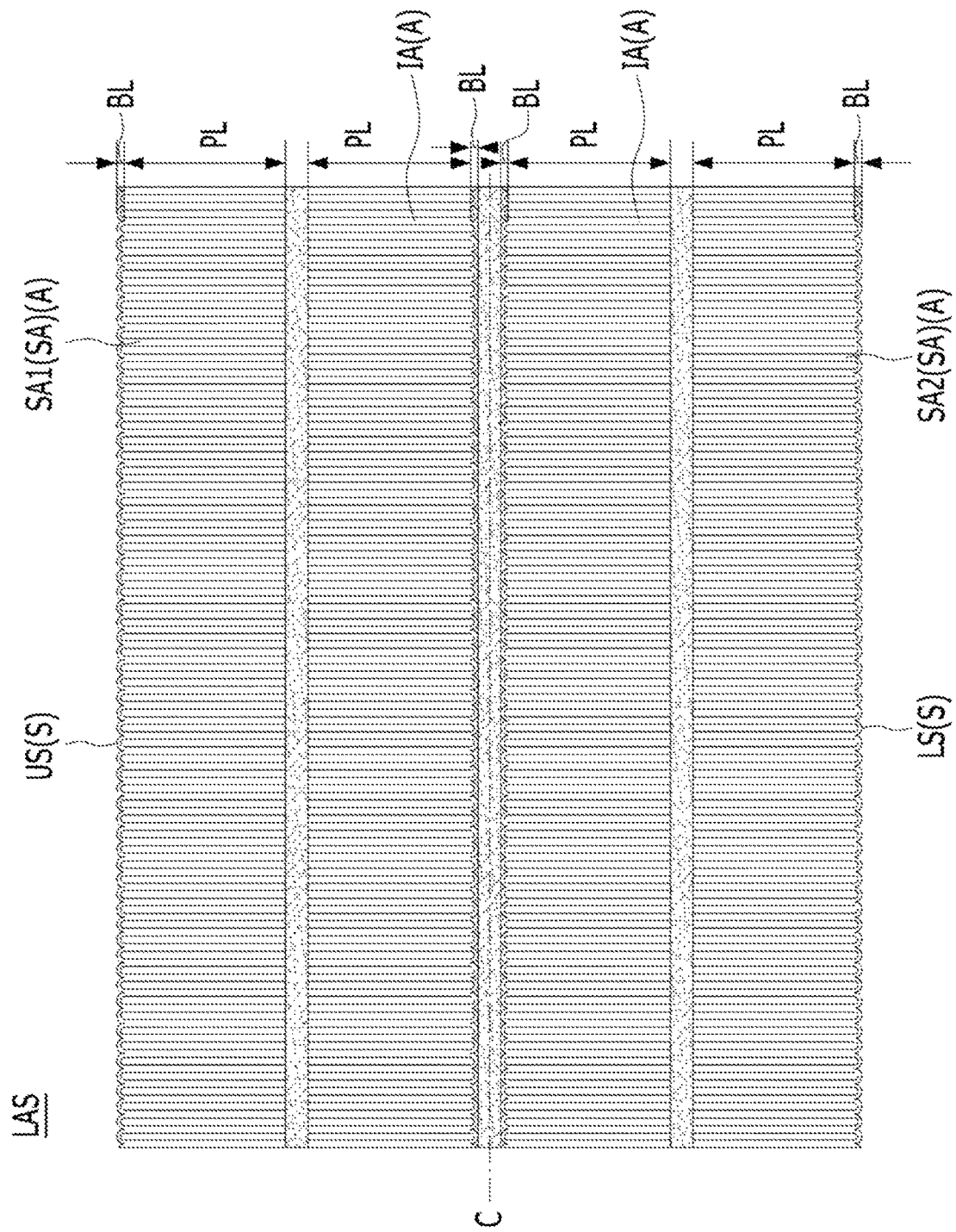
FIGS. 5A, 5B, 5C, 6A, and 6B are views illustrating a laminated anodic aluminum oxide structure according to the first exemplary embodiment of the present disclosure, which is composed of an even number of anodic aluminum oxide sheets, and modified examples thereof.
Figure 5B:
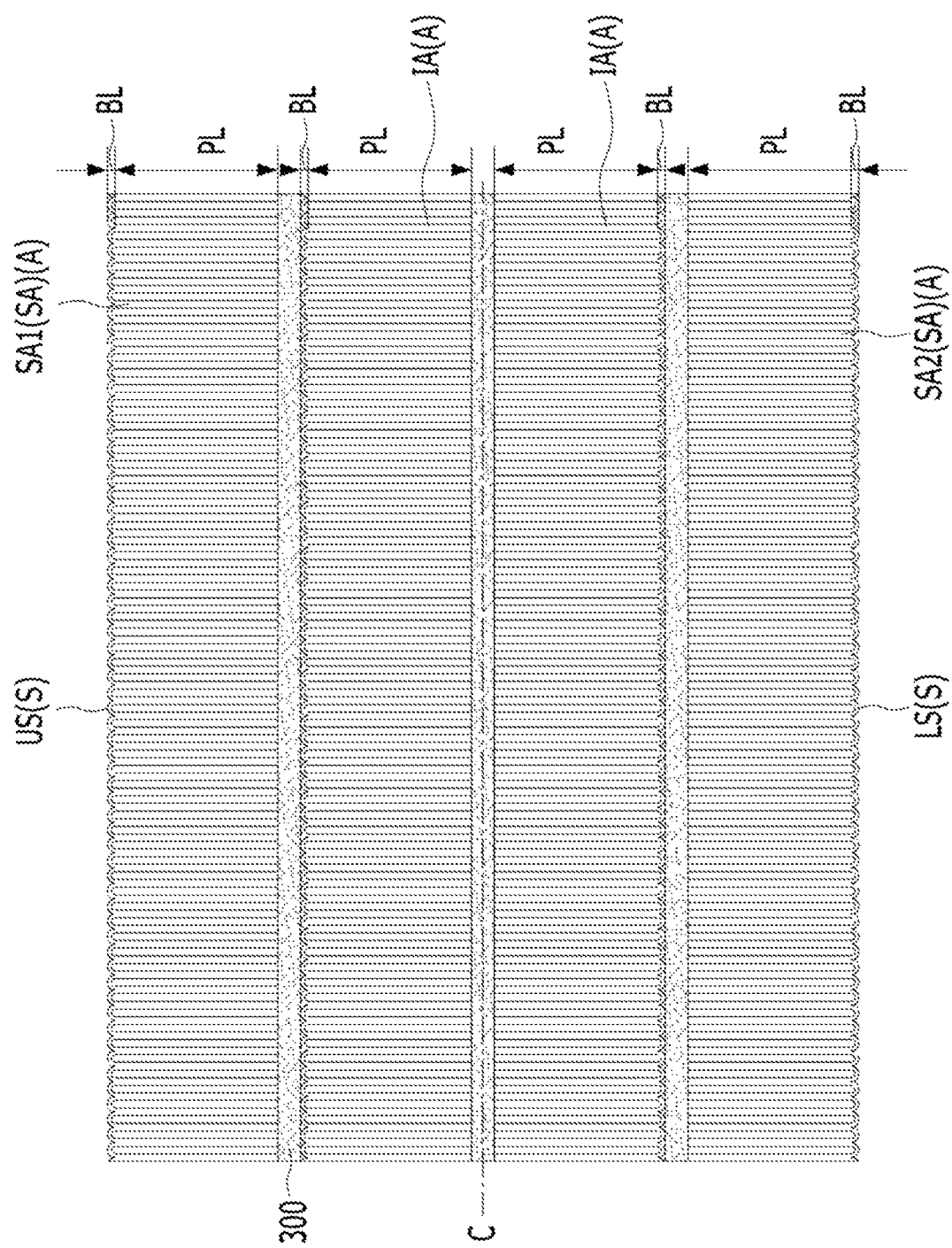
Figure 5C:
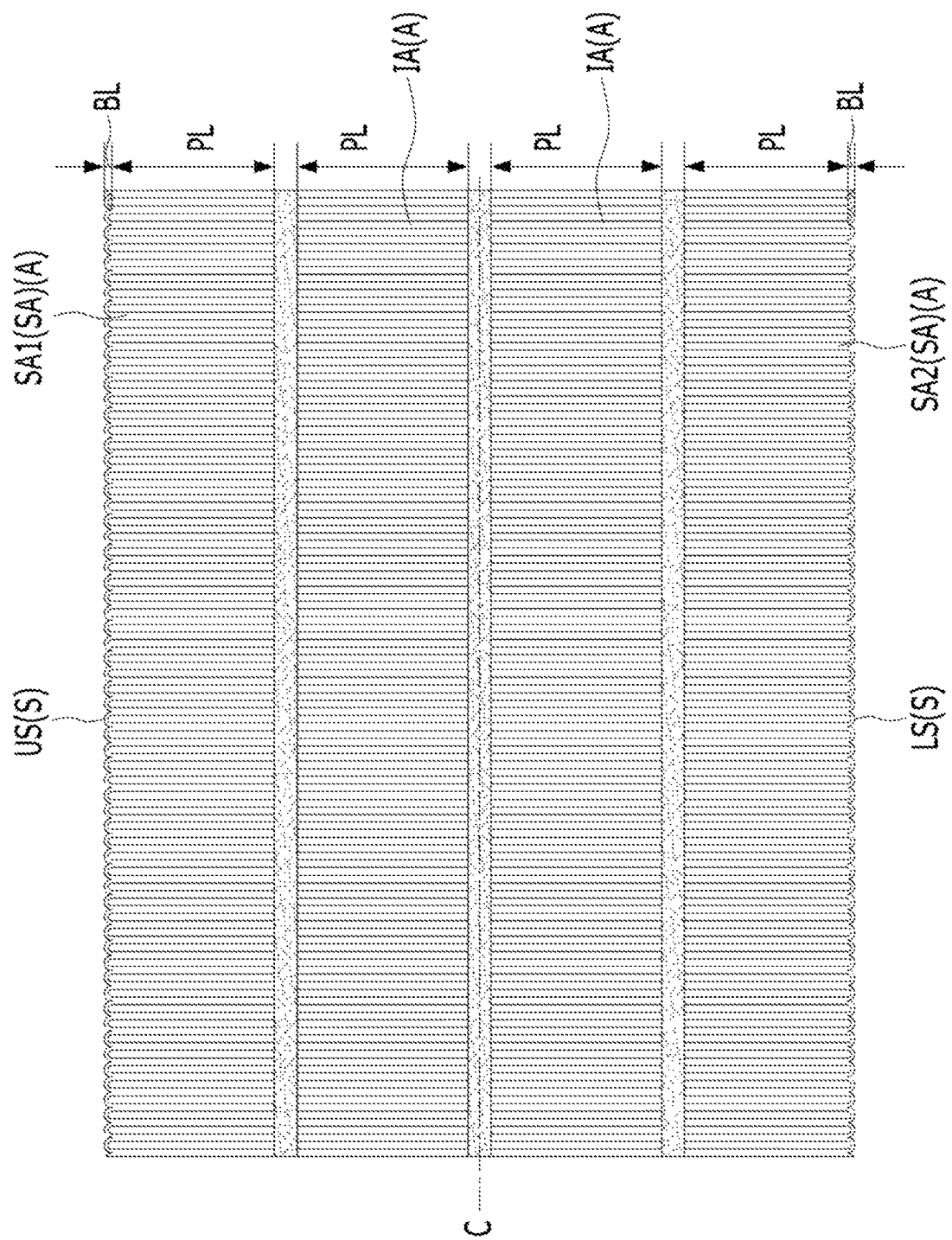

FIGS. 5A to 5C illustrate a laminated anodic aluminum oxide structure LAS according to the first exemplary embodiment of the present disclosure composed of an even number of anodic aluminum oxide sheets A, in which surfaces S and the entire upper and lower portions of the structure are vertically symmetrical with respect to a cross-sectional center line C.

As illustrated in FIG. 5A, the laminated anodic aluminum oxide structure LAS according to the first exemplary embodiment of the present disclosure may be composed of upper and lower surface-side anodic aluminum oxide sheets SA1 and SA2, and an even number of inner-side anodic aluminum oxide sheets IA provided therebetween. As an example, two inner-side anodic aluminum oxide sheets IA may be provided between the upper and lower surface-side anodic aluminum oxide sheets SA1 and SA2.

As illustrated in FIG. 5A, each of the inner-side anodic aluminum oxide sheets IA may include a barrier layer BL and a porous layer PL. In this case, a neighboring inner-side anodic aluminum oxide sheet IA positioned adjacent under the upper surface-side anodic aluminum oxide sheet SA1 may have a structure in which the barrier layer BL is provided under the porous layer PL. Therefore, with respect to a cross-sectional center line C, at a position above the cross-sectional center line C, the upper surface-side anodic aluminum oxide sheet SA1 and the neighboring inner-side anodic aluminum oxide sheet IA joined thereto may be vertically symmetrical with respect to a junction layer 300 for joining the two configurations SA1 and IA.

In addition, a neighboring inner-side anodic aluminum oxide sheet IA positioned adjacent on the lower surface-side anodic aluminum oxide sheet SA2 may have a structure in which the barrier layer BL is provided on the porous layer PL. Therefore, with respect to the cross-sectional center line C, at a position above the cross-sectional center line C, the lower surface-side anodic aluminum oxide sheet SA2 and the neighboring inner-side anodic aluminum oxide sheet IA joined thereto may be vertically symmetrical with respect to a junction layer 300 for joining the two configurations SA2 and IA.

When the laminated anodic aluminum oxide structure LAS according to the first exemplary embodiment of the present disclosure is composed of the even number of anodic aluminum oxide sheets A, the upper surface-side anodic aluminum oxide sheet SA1 and the inner-side anodic aluminum oxide sheet IA positioned above the cross-sectional center line C may be vertically symmetrical with respect to the junction layer 300. In addition, the lower surface-side anodic aluminum oxide sheet SA2 and the inner-side anodic aluminum oxide sheet IA positioned below the cross-sectional center line C may be vertically symmetrical with respect to the junction layer 300.

With such a structure, the laminated anodic aluminum oxide structure LAS according to the first exemplary embodiment of the present disclosure may have a structure in which the surfaces S are configured as barrier layers BL of anodic aluminum oxide films with respect to the cross-sectional center line C, and the entire upper and lower portions of the structure are vertically symmetrical with respect to the cross-sectional center line C.

In other words, the laminated anodic aluminum oxide structure LAS according to the first exemplary embodiment of the present disclosure may have a structure in which not only the surfaces S configured as the barrier layers BL of the anodic aluminum oxide films, but also the entire upper and lower portions thereof are vertically symmetrical with respect to the cross-sectional center line C. Therefore, when used in a specific field (specifically, a semiconductor or a display field) and exposed to a high-temperature environment, the laminated anodic aluminum oxide structure LAS according to the first exemplary embodiment of the present disclosure may exhibit an excellent effect in terms of prevention of warpage deformation due to heat.

As illustrated in FIG. 5B, a laminated anodic aluminum oxide structure LAS according to the first exemplary embodiment of the present disclosure may include an even number of inner-side anodic aluminum oxide sheets IA modified in structure. As illustrated in FIG. 5B, each of the inner-side anodic aluminum oxide sheets IA may include a porous layer PL and a barrier layer BL. In this case, a neighboring inner-side anodic aluminum oxide sheet IA positioned adjacent under an upper surface-side anodic aluminum oxide sheet SA1 may have a structure in which the barrier layer BL is provided on the porous layer PL. In addition, a neighboring inner-side anodic aluminum oxide sheet IA positioned adjacent on the lower surface-side anodic aluminum oxide sheet SA2 may have a structure in which the barrier layer BL is provided under the porous layer PL. Therefore, the inner-side anodic aluminum oxide sheets IA positioned above and below a cross-sectional center line C may be vertically symmetrical with respect thereto. In addition, the upper and lower surface-side anodic aluminum oxide sheets SA1 and SA2 may be vertically symmetrical with respect to the cross-sectional center line C.

When the laminated anodic aluminum oxide structure LAS according to the first exemplary embodiment of the present disclosure is composed of the even number of anodic aluminum oxide sheets A, with respect to the cross-sectional center line C, the inner-side anodic aluminum oxide sheets IA positioned above and below the cross-sectional center line C may be vertically symmetrical, and the surface-side anodic aluminum oxide sheets SA1 and SA2 may be vertically symmetrical. Therefore, the laminated anodic aluminum oxide structure LAS according to the first exemplary embodiment of the present disclosure may have a structure in which surfaces S and the entire upper and lower portions thereof are vertically symmetrical with respect to the cross-sectional center line C.

With such a symmetry structure, the laminated anodic aluminum oxide structure LAS according to the first exemplary embodiment of the present disclosure may have a symmetric density vertically. As a result, the laminated anodic aluminum oxide structure LAS according to the first exemplary embodiment of the present disclosure may be prevented from experiencing warpage deformation due to heat and improved in durability.

As illustrated in FIG. 5C, an inner-side anodic aluminum oxide sheet IA may include only a porous layer PL. Specifically, each of an even number of inner-side anodic aluminum oxide sheets IA provided between surface-side anodic aluminum oxide sheets SA may include only a porous layer PL.

Therefore, the laminated anodic aluminum oxide structure LAS according to the first exemplary embodiment of the present disclosure may have a structure in which the inner-side anodic aluminum oxide sheets IA each having only the porous layer PL are positioned above and below a cross-sectional center line C. With the provision of the inner-side anodic aluminum oxide sheets IA each having only the porous layer PL, the laminated anodic aluminum oxide structure LAS according to the first exemplary embodiment of the present disclosure may have a structure in which surfaces S and the entire upper and lower portions thereof are vertically symmetrical with respect to the cross-sectional center line C. With such a structure, the laminated anodic aluminum oxide structure LAS according to the first exemplary embodiment of the present disclosure may have a symmetric density vertically.

Figure 6A:
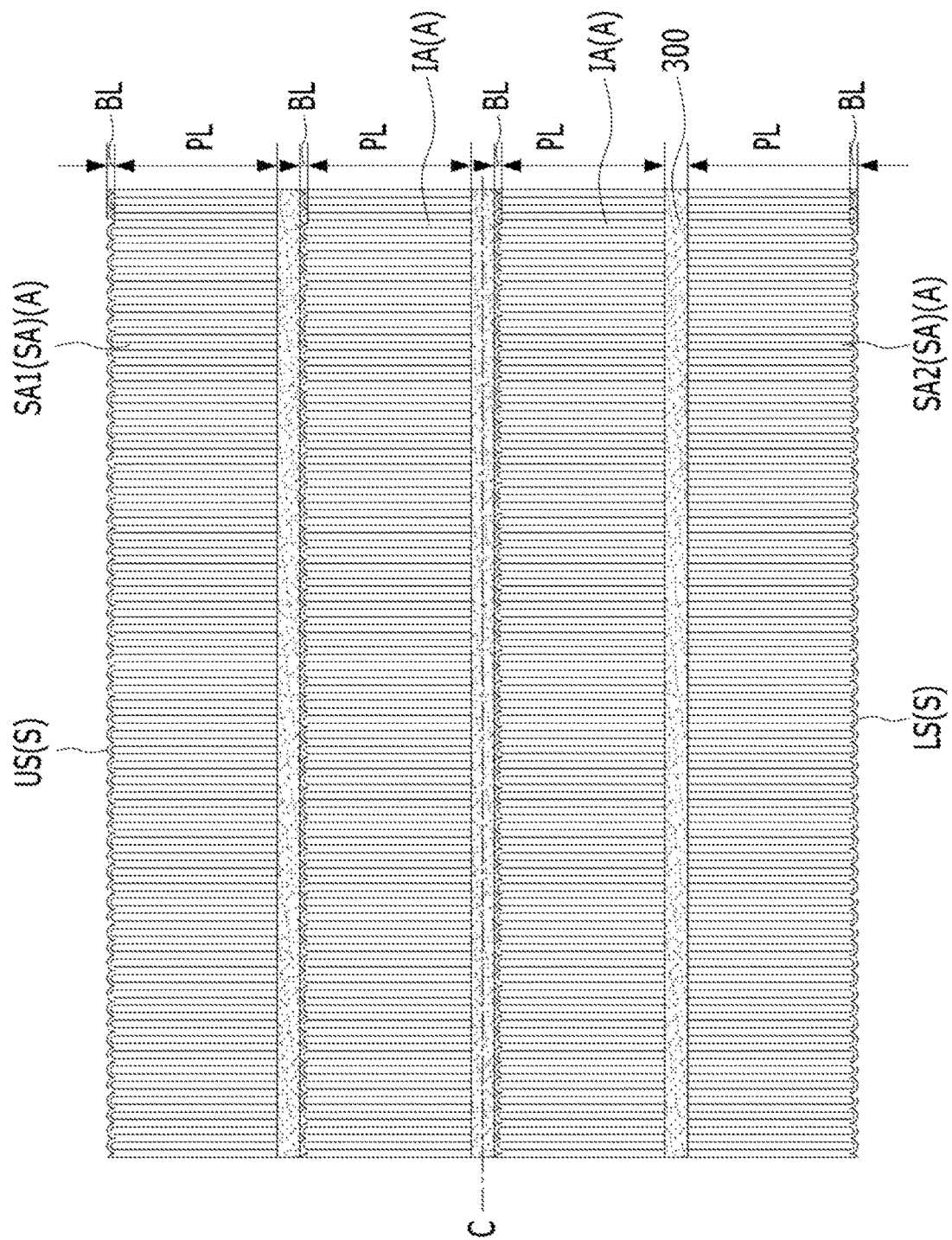
Figure 6B:
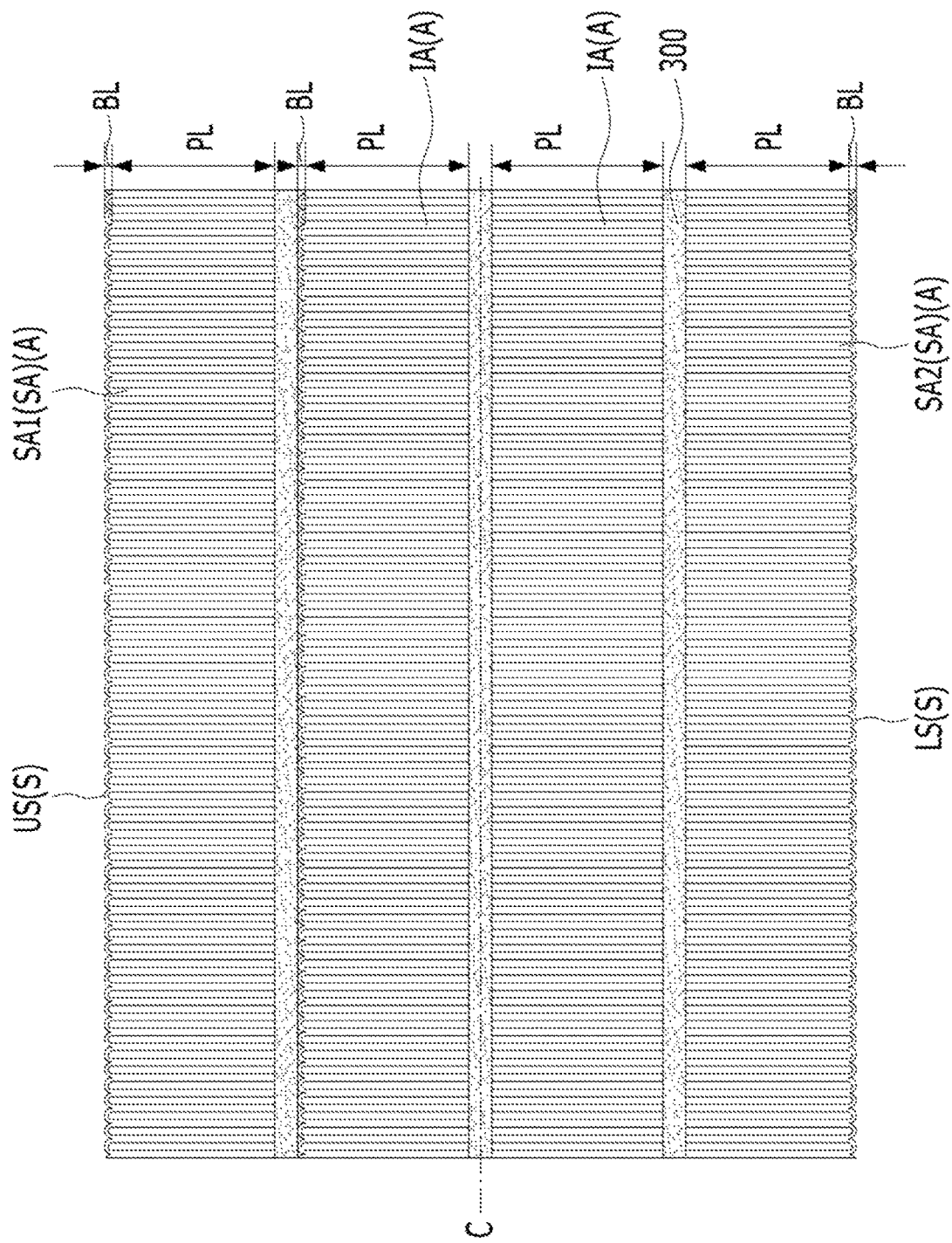

FIGS. 6A and 6B are views illustrating modified examples of the laminated anodic aluminum oxide structure LAS according to the first exemplary embodiment of the present disclosure, which is composed of the even number of anodic aluminum oxide sheets A. A modified example may have a structure in which only surfaces S are vertically symmetrical with respect to a cross-sectional center line C. Specifically, the modified example may have a structure in which the surfaces S are configured as barrier layers BL of anodic aluminum oxide films so as to be vertically symmetrical.

As illustrated in FIG. 6A, a laminated anodic aluminum oxide structure LAS according to the first exemplary embodiment of the present disclosure may include an even number (specifically, two) of inner-side anodic aluminum oxide sheets IA each having a porous layer PL and a barrier layer BL. In this case, a neighboring inner-side anodic aluminum oxide sheet IA positioned adjacent under an upper surface-side anodic aluminum oxide sheet SA1 may have a structure in which the barrier layer BL is provided on the porous layer PL. In addition, a neighboring inner-side anodic aluminum oxide sheet IA positioned adjacent on the lower surface-side anodic aluminum oxide sheet SA2 may have a structure in which the barrier layer BL is provided on the porous layer PL.

Therefore, the laminated anodic aluminum oxide structure LAS according to the first exemplary embodiment of the present disclosure may have a vertical symmetry structure in which the surfaces S are configured as the barrier layers BL of the anodic aluminum oxide films so as to be vertically symmetrical with respect to the cross-sectional center line C.

On the other hand, as illustrated in FIG. 6B, a laminated anodic aluminum oxide structure LAS according to the first exemplary embodiment of the present disclosure may include two inner-side anodic aluminum oxide sheets IA composed of an inner-side anodic aluminum oxide sheet IA having a porous layer PL and a barrier layer BL and an inner-side anodic aluminum oxide sheet IA having only a porous layer PL. When the inner-side anodic aluminum oxide sheet IA is modified in structure, the position of the inner-side anodic aluminum oxide sheet IA is not limited to any position as long as it is between surface-side anodic aluminum oxide sheets SA.

In FIG. 6B, as an example, the inner-side anodic aluminum oxide sheet IA having the porous layer PL and the barrier layer BL may be positioned adjacent under an upper surface-side anodic aluminum oxide sheet SA1. In addition, the inner-side anodic aluminum oxide sheet IA having only the porous layer PL may be positioned adjacent on a lower surface-side anodic aluminum oxide sheet SA2.

As illustrated in FIGS. 6A and 6B, each of the modified examples may be composed of an even number of anodic aluminum oxide sheets A, with the inner-side anodic aluminum oxide sheets IA modified in various structures. In this case, in each of the modified examples, the upper and lower surface-side anodic aluminum oxide sheets SA may be symmetrical with respect to the cross-sectional center line C. Therefore, the modified examples may have an effect of having excellent surface strength.

As described above with reference to FIGS. 1 to 6B, with a laminated structure formed by the use of the junction layer 300, the laminated anodic aluminum oxide structure according to the first exemplary embodiment of the present disclosure may have excellent mechanical strength. In addition, with a structure in which the surfaces S are configured as the barrier layers BL of the anodic aluminum oxide films so as to be vertically symmetrical with respect to the cross-sectional center line C in the laminated structure, the laminated anodic aluminum oxide structure LAS according to the first exemplary embodiment of the present disclosure may have a uniform surface density.

Figure 7:
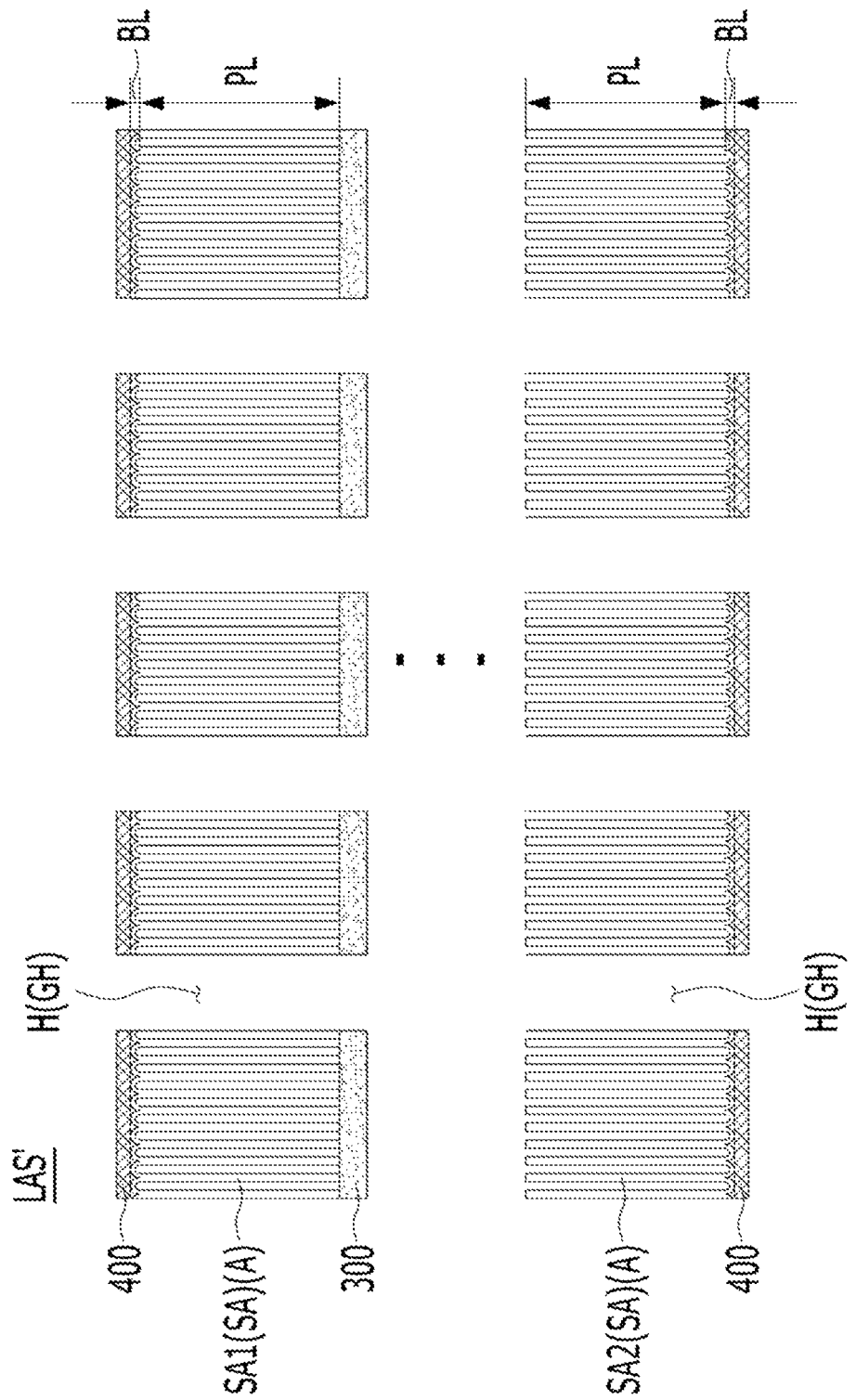
FIG. 7 is a view illustrating a laminated anodic aluminum oxide structure according to a second exemplary embodiment of the present disclosure.

Laminated Anodic Aluminum Oxide Structure According to Second Exemplary Embodiment of the Present Disclosure FIG. 7 is a view illustrating a laminated anodic aluminum oxide structure LAS' according to a second exemplary embodiment of the present disclosure. The laminated anodic aluminum oxide structure LAS' according to the second exemplary embodiment of the present disclosure may be composed of an odd number or even number of anodic aluminum oxide sheets A. Therefore, the laminated anodic aluminum oxide structure LAS' according to the second exemplary embodiment of the present disclosure may be provided in various structures, including the structure of the laminated anodic aluminum oxide structure LAS according to the first exemplary embodiment of the present disclosure and the structures of the modified examples thereof. Therefore, in FIG. 7, the laminated anodic aluminum oxide structure LAS' according to the second exemplary embodiment of the present disclosure is schematically illustrated in a structure in which the number of the anodic aluminum oxide sheets A is not limited.

The laminated anodic aluminum oxide structure LAS' according to the second exemplary embodiment of the present disclosure differs from the laminated anodic aluminum oxide structure LAS according to the first exemplary embodiment of the present disclosure in that an atomic deposition layer 400 is provided on a surface of a barrier layer BL forming each of surfaces S. Therefore, in the following description of the laminated anodic aluminum oxide structure LAS' according to the second exemplary embodiment of the present disclosure, characteristic configurations will be mainly described, and descriptions of the same configuration will be omitted.

In the laminated anodic aluminum oxide structure LAS' according to the second exemplary embodiment of the present disclosure, a ceramic material (alumina, nitride, etc.) may be deposited on the surface of the barrier layer BL forming each of the surfaces S.

Specifically, as illustrated in FIG. 7, in the laminated anodic aluminum oxide structure LAS' according to the second exemplary embodiment of the present disclosure, the atomic deposition layer 400 may be formed on the surface of the barrier layer BL forming each of the surfaces S by an atomic layer deposition (ALD) method. The atomic deposition layer 400 may be made of at least one of aluminum oxide ($Al_2O_3$), yttrium oxide ($Y_2O_3$), and aluminum nitride (AlN).

With the provision of the atomic vapor deposition layers 400 on the surface of each of the respective barrier layers BL in a structure in which density of the surfaces S is improved by the barrier layers BL, the laminated anodic aluminum oxide structure LAS' according to the second exemplary embodiment of the present disclosure may exhibit an effect of significantly improving strength of the surfaces S.

On the other hand, a laminated anodic aluminum oxide structure LAS' according to the second exemplary embodiment of the present disclosure may include surface-side anodic aluminum oxide sheets SA each having only a porous layer PL. In this case, surfaces thereof may be in an open state by pores P of the respective porous layers PL. The laminated anodic aluminum oxide structure LAS' according to the second exemplary embodiment of the present disclosure may include an atomic deposition layer 400 on a surface of each of the porous layers PL. Accordingly, the laminated anodic aluminum oxide structure LAS' according to the second exemplary embodiment of the present disclosure may have a structure in which the surfaces are closed by the respective atomic deposition layers 400.

In the process of forming the respective atomic deposition layers 400, the pores P of the porous layers PL in the surfaces of the laminated anodic aluminum oxide structure LAS' according to the second exemplary embodiment of the present disclosure may be filled so that no spaces exist in the pores P. Therefore, since the surfaces thereof are closed and no internal spaces exist, the laminated anodic aluminum oxide structure LAS' according to the second exemplary embodiment of the present disclosure may be prevented from experiencing a problem in which external particles flow thereinto.

In addition, with the provision of the atomic deposition layers 400 on the surfaces of the porous layers PL, the laminated anodic aluminum oxide structure LAS' according to the second exemplary embodiment of the present disclosure may have improved surface strength.

However, in the laminated anodic aluminum oxide structure LAS' according to the second exemplary embodiment of the present disclosure, an atomic deposition layer 400 is preferably formed on a surface of each of barrier layers BL having no pores P. In case where the atomic deposition layer 400 is provided on the surface of each of the barrier layers BL, even if the atomic deposition layer 400 has a small thickness, surface rigidity and/or strength may be significantly improved. Therefore, it may not take a long time to form the atomic deposition layers 400. In other words, an efficient manufacturing process may be possible. Therefore, with the provision of the atomic deposition layers 400 preferably on the surfaces of the barrier layers BL as illustrated in FIG. 7, the laminated anodic aluminum oxide structure LAS' according to the second exemplary embodiment of the present disclosure may exhibit an effect of having excellent surface strength and significantly improved durability.

Each of the laminated anodic aluminum oxide structures LAS and LAS' according to the first and second exemplary embodiments of the present disclosure may be used alone, and may be used as a part of a structure combined with an adjacent configuration. In addition, the through-holes H of the laminated anodic aluminum oxide structures LAS and LAS' according to the first and second exemplary embodiments of the present disclosure may function as conduits for allowing passage of an object including a solid of liquid, and may exhibit an effect of insulating the object passing therethrough from the surrounding environment.

At least one of the laminated anodic aluminum oxide structures LAS and LAS' according to the first and second exemplary embodiments of the present disclosure described above may be provided in a probe card 1 according to an exemplary embodiment of the present disclosure.

Figure 8:
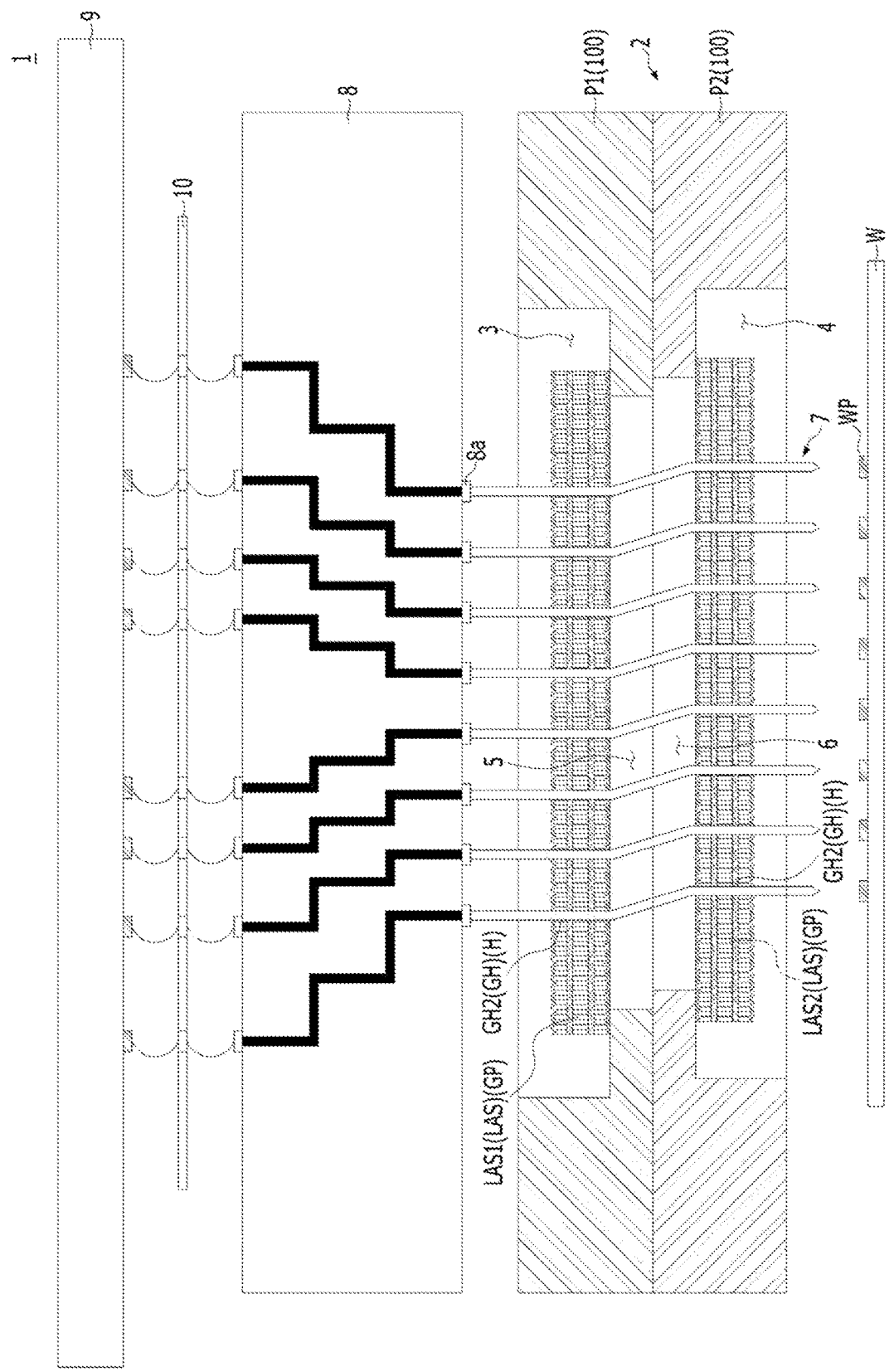
FIG. 8 is a view schematically illustrating a probe card having the laminated anodic aluminum oxide structure according to the first exemplary embodiment of the present disclosure.

FIG. 8 is a view schematically illustrating the probe card 1 according to the exemplary embodiment of the present disclosure.

In FIG. 8, as an example, it is illustrated that the probe card 1 according to the exemplary embodiment of the present disclosure includes laminated anodic aluminum oxide structures LAS according to the first exemplary embodiment of the present disclosure.

More specifically, in FIG. 8, as an example, it is illustrated that each of the laminated anodic aluminum oxide structures LAS according to the first exemplary embodiment of the present disclosure is composed of three anodic aluminum oxide sheets A, including surface-side anodic aluminum oxide sheets SA each having a porous layer PL and a barrier layer BL and an inner-side anodic aluminum oxide sheet IA having only a porous layer BL. However, the probe card 1 according to the exemplary embodiment of the present disclosure may include a laminated anodic aluminum oxide structure LAS implemented in various structures, including the above-described laminated anodic aluminum oxide structure LAS according to the first exemplary embodiment of the present disclosure, the modified examples thereof, and the laminated anodic aluminum oxide structure LAS' according to the second exemplary embodiment of the present disclosure. In other words, the structure of the laminated anodic aluminum oxide structures LAS according to the first exemplary embodiment of the present disclosure provided in the probe card 1 according to the exemplary embodiment of the present disclosure is not limited to that illustrated in FIG. 8.

FIG. 8 schematically illustrates the probe card 1 including a probe head 1 having the laminated anodic aluminum oxide structures LAS according to the first exemplary embodiment of the present disclosure.

Depending on the structure of installing a plurality of probes 7 on a wiring substrate and the structure of the probes 7, the types of the probe card 1 may be classified into a vertical type probe card, a cantilever type probe card, and a micro-electro-mechanical system (MEMS) probe card.

The laminated anodic aluminum oxide structures LAS according to the first exemplary embodiment of the present disclosure may be provided in a vertical type probe card 1 as an example.

As illustrated in FIG. 8, the probe card 1 according to the exemplary embodiment of the present disclosure includes: a space transformer 8 including a probe connection pad 8a electrically connected to each of the plurality of probes 7; an interposer 10 electrically connecting the space transformer 8 and a circuit board 9 to each other at a position between the space transformer 8 and the circuit board 9; and the probe head 2 provided below the space transformer 8.

The circuit board 9 may be provided above the space transformer 8, and the probe head 2 having the laminated anodic aluminum oxide structures LAS according to the first exemplary embodiment of the present disclosure may be provided below the space transformer 8. The space transformer 8 may be made of an anodic aluminum oxide film. The space transformer 8 may be made of the same anodic aluminum oxide film as the laminated anodic aluminum oxide structures LAS according to the first exemplary embodiment of the present disclosure. Therefore, the space transformer 8 made of the anodic aluminum oxide film may have an advantage of undergoing a small degree of thermal deformation under a high-temperature environment. However, the material of the space transformer 8 is not limited thereto, and may be ceramic or synthetic resin.

The space transformer 8 may include the respective probe connection pads 8a electrically connected to the plurality of probes 7. Each of the probes 7 provided in the probe head 2 provided below the space transformer 8 may be brought into contact with an associated one of the probe connection pads 8a. In this case, the probes 7 may be supported by the laminated anodic aluminum oxide structures LAS according to the first exemplary embodiment of the present disclosure configured as guide plates GP provided in the probe head 2. Therefore, when the space transformer 8 and the laminated anodic aluminum oxide structures LAS according to the first exemplary embodiment of the present disclosure are made of the same anodic aluminum oxide film, this may prevent a problem in which contact positions of the probes 7 with respect to the probe connection pads 8a are misaligned due to thermal expansion under a high-temperature environment.

Specifically, the probe card 1 according to the exemplary embodiment of the present disclosure may perform a burn-in test to ensure reliability of chips. The burn-in test may be conducted under a high-temperature environment of 85° C. or 100° C. Therefore, the space transformer 8 and the laminated anodic aluminum oxide structures LAS according to the first exemplary embodiment of the present disclosure may be exposed to high temperature. In this case, each of the space transformer 8 and the laminated anodic aluminum oxide structures LAS according to the first exemplary embodiment of the present may be made of an anodic aluminum oxide film having a coefficient of thermal expansion close to that of a wafer W. Therefore, even when exposed to a high-temperature environment, the space transformer 8 and the laminated anodic aluminum oxide structures LAS may have a minimum degree of thermal deformation due to heat. In addition, even when exposed to a high-temperature environment, a problem in which the contact positions of the probes 7 with respect to the probe connection pads 8*a* are misaligned due to thermal deformation may be prevented.

The probe head 2 constituting the probe card 1 according to the exemplary embodiment of the present disclosure may include the guide plates GP using the laminated anodic aluminum oxide structures according to the first exemplary embodiment of the present disclosure, each of the guide plates GP having guide holes GH for allowing insertion of the probes 7. In other words, the probe head 2 may include the laminated anodic aluminum oxide structures LAS according to the first exemplary embodiment of the present disclosure.

The laminated anodic aluminum oxide structures LAS according to the first exemplary embodiment of the present disclosure may be configured as the guide plates GP to support the probes 7 to accurately determining the contact positions of the probes 7.

As illustrated in FIG. 8, each of the laminated anodic aluminum oxide structures LAS may be configured so that the probes 7 are provided and supported in through-holes H configured as the guide holes GH.

The laminated anodic aluminum oxide structures LAS according to the first exemplary embodiment of the present disclosure constituting the probe card 1 according to the exemplary embodiment of the present disclosure may be composed of an upper laminated anodic aluminum oxide structure LAS1 having upper guide holes GH1 and a lower laminated anodic aluminum oxide structure LAS2 having lower guide holes GH2.

As illustrated in FIG. 8, the laminated anodic aluminum oxide structures LAS may be supported by plates 100 including first and second plates P1 and P2.

The first and second plates P1 and P2 may have structures corresponding to each other, and may be coupled to each other in inverted shapes. Specifically, the second plate P2 may be coupled to the bottom of the first plate P1 in a shape inverted from the first plate P1. The plates 100 may include the laminated anodic aluminum oxide structures LAS according to the present disclosure thereon.

The first plate P1 may include an upper seating region 3 for providing the upper laminated anodic aluminum oxide structure LAS1. The second plate P2 may include a lower seating region 4 for providing the lower laminated anodic aluminum oxide structure LAS2. The first and second plates P1 and P2 may be coupled to each other in inverted shapes. Therefore, the upper seating region 3 and the lower seating region 4 may be provided in the same shape at inverted positions.

Each of the laminated anodic aluminum oxide structures LAS according to the first exemplary embodiment of the present disclosure may have an area smaller than that of each of the plates 100. Therefore, except for a surface of each of the plates 100 where each of the laminated anodic aluminum oxide structures LAS is provided, a remaining surface thereof may be exposed.

The laminated anodic aluminum oxide structures LAS according to the first exemplary embodiment of the present disclosure may be manufactured in a size and structure suitable for a configuration in which the laminated anodic aluminum oxide structures LAS are provided. Therefore, when provided in the probe card 1 according to the exemplary embodiment of the present disclosure, the laminated anodic aluminum oxide structures LAS according to the first exemplary embodiment of the present disclosure may exhibit an effect of facilitating handling of the probe card 1.

Since the laminated anodic aluminum oxide structures LAS according to the first exemplary embodiment of the present disclosure may have the probes 7 therein, the laminated anodic aluminum oxide structures LAS may be a configuration forming a substantial probing region. In this case, since each of the laminated anodic aluminum oxide structures LAS may have an area smaller than that of each of the plates 100, this may minimize the risk of destroying or damaging the probing region.

The first plate P1 may have a first through-hole 5 formed in a lower portion of the upper seating region 3, and the second plate P2 may have a second through-hole 6 formed in an upper portion of the lower seating region 4.

The first and second through-holes 5 and 6 may be provided to allow the plurality of probes 7 inserted through the guide holes GH of the laminated anodic aluminum oxide structures LAS to be positioned therein. Therefore, the first and second through-holes 5 and 6 may have an inner diameter that can accommodate elastic deformation of the plurality of probes 7.

The plates 100 may include the laminated anodic aluminum oxide structures LAS in the respective seating regions 3 and 4.

The upper laminated anodic aluminum oxide structure LAS1 may be provided in the upper seating region 3 provided in the first plate P1, and the lower laminated anodic aluminum oxide structure LAS2 may be provided in the lower seating region 4 provided in the second plate P2.

The upper laminated anodic aluminum oxide structure LAS1 may have the upper guide holes GH1, and the lower laminated anodic aluminum oxide structure LAS2 may have the lower guide holes GH2. Therefore, the guide holes H of the laminated anodic aluminum oxide structures LAS may include the upper and lower guide holes GH1 and GH2.

The probes 7 may be separately manufactured and provided. Respective pointed first ends of the probes 7 may be first inserted through the upper guide holes GH1 and then inserted through the lower guide holes GH2 so as to protrude out of the lower guide holes GH2.

Each of the laminated anodic aluminum oxide structures LAS according to the first exemplary embodiment of the present disclosure may function to guide respective front ends of the probes 7 through the guide holes GH. Each of the laminated anodic aluminum oxide structures LAS according to the first exemplary embodiment of the present disclosure may have a vertical symmetry structure in which surfaces S are configured as barrier layers BL of anodic aluminum oxide films so as to be vertically symmetrical with respect to a cross-sectional center line C. This may secure a uniform density of the surfaces S. Therefore, each of the laminated anodic aluminum oxide structures LAS according to the present disclosure may be prevented from experiencing abrasion of inner walls of openings of the guide holes GH that may occur simultaneously with the insertion of the probes 7.

Specifically, in each of the laminated anodic aluminum oxide structures LAS according to the first exemplary embodiment of the present disclosure, since the barrier layers BL may form the surfaces S, openings of the through-holes H configured as the guide holes GH may be positioned in the barrier layers BL. The barrier layers BL may have a relatively high degree of density. Therefore, the openings of the guide holes GH may have a high degree of durability. This may prevent abrasion of the inner walls of the openings of the guide holes GH that may occur simultaneously with the insertion of the probes 7.

In case of each of the guide plates GP, when the probes 7 are inserted through the guide holes GH, abrasion may occur on the inner walls of the guide holes GH as the front ends of the probes 7 are abraded against the guide holes GH. In this process, particles may be generated, and these particles may flow into the guide plate GP, thereby causing a problem of degrading the overall performance of the probe head 2 of the probe card 1.

However, in each of the laminated anodic aluminum oxide structures LAS according to the first exemplary embodiment, the openings of the guide holes GH may be positioned in the barrier layers BL having a relatively high degree of density. Therefore, durability of the openings of the guide holes GH may be improved, thereby preventing abrasion of the openings and generation of particles, which are caused by the insertion of the probes 7. In addition, each of the laminated anodic aluminum oxide structures LAS according to the first exemplary embodiment of the present disclosure may have excellent wear resistance in terms of sliding friction between the guide holes GH and the probes 7.

In addition, with the structure in which the surfaces S configured as the barrier layers BL of the anodic aluminum oxide films are vertically symmetrical with respect to the cross-sectional center line C, each of the laminated anodic aluminum oxide structures LAS according to the first exemplary embodiment of the present disclosure may have improved surface strength. Therefore, warpage deformation due to heat under a high-temperature environment may be prevented.

Therefore, with the provision of the laminated anodic aluminum oxide structures LAS according to the first exemplary embodiment of the present disclosure, which are prevented from experiencing warpage deformation under a high-temperature environment and has a high degree of durability, the probe card 1 according to the exemplary embodiment of the present disclosure may more effectively perform a high-temperature process such as a burn-in test process.

As described above, the laminated anodic aluminum oxide structure LAS according to the first exemplary embodiment of the present disclosure may have a structure in which the surfaces S configured as the barrier layers BL are vertically symmetrical with respect to the cross-sectional center line C. Such a structure may prevent warpage deformation under a high-temperature environment.

In addition, with the laminated structure in which the plurality of anodic aluminum oxide sheets A are stacked, the laminated anodic aluminum oxide structure LAS according to the first exemplary embodiment of the present disclosure may have a high degree of rigidity and/or strength.

In other words, the laminated anodic aluminum oxide structure LAS according to the first exemplary embodiment of the present disclosure may not only have excellent mechanical strength due to its laminated structure, but may have improved surface strength due to the surfaces S configured as the barrier layers BL so as to be vertically symmetrical with the respect to the cross-sectional center line C. In addition, by being prevented from warpage deformation, the laminated anodic aluminum oxide structure LAS may exhibit an effect of improving its durability.

As described above, the present disclosure has been described with reference to the exemplary embodiments. However, those skilled in the art will appreciate that various modifications, additions and substitutions are possible, without departing from the scope and spirit of the present disclosure as disclosed in the accompanying claims.

What is claimed is:

1. A laminated anodic aluminum oxide structure, comprising:
    a plurality of anodic aluminum oxide sheets; and
    a junction layer provided between the anodic aluminum oxide sheets to join the anodic aluminum oxide sheets to each other,
    wherein an uppermost anodic aluminum oxide sheet of the anodic aluminum oxide sheets comprises a first barrier layer, and a lowermost anodic aluminum oxide sheet of the anodic aluminum oxide sheets comprises a second barrier layer, and
    wherein an upper surface of the laminated anodic aluminum oxide structure is configured as the first barrier layer, and a lower surface of the laminated anodic aluminum oxide structure is configured as the second barrier layer.

2. The laminated anodic aluminum oxide structure of claim 1, wherein the junction layer is a photosensitive material.

3. The laminated anodic aluminum oxide structure of claim 1, wherein each of the anodic aluminum oxide sheets comprises a through-hole.

4. The laminated anodic aluminum oxide structure of claim 1, wherein the anodic aluminum oxide sheets further comprise:
    an inner-side anodic aluminum oxide sheet provided between the uppermost and lowermost anodic aluminum oxide sheets,
    wherein each of the uppermost and lowermost anodic aluminum oxide sheets further comprises a porous layer having pores, the first barrier layer of the uppermost anodic aluminum oxide sheet and the second barrier layer of the lowermost anodic aluminum oxide sheet having no pores, and
    wherein the inner-side anodic aluminum oxide sheet comprises only a porous layer having pores.

5. The laminated anodic aluminum oxide structure of claim 1, wherein the anodic aluminum oxide sheets further comprise:
    an inner-side anodic aluminum oxide sheet provided between the uppermost and lowermost anodic aluminum oxide sheets,
    wherein the inner-side anodic aluminum oxide sheet comprises a porous layer having pores and a barrier layer having no pores.

6. A guide plate of a probe card, the guide plate using a laminated anodic aluminum oxide structure having a guide hole for allowing insertion of a probe of a probe card,
    wherein the laminated anodic aluminum oxide structure comprises:
    a plurality of anodic aluminum oxide sheets; and a junction layer provided between the anodic aluminum oxide sheets to join the anodic aluminum oxide sheets to each other, and wherein an uppermost anodic aluminum oxide sheet of the anodic aluminum oxide sheets comprises a first barrier layer, and a lowermost anodic aluminum oxide sheet of the anodic aluminum oxide sheets comprises a second barrier layer, and wherein an upper surface of the laminated anodic aluminum oxide structure is configured as the first barrier layer, and a lower surface of the laminated anodic aluminum oxide structure is configured as the second barrier layer.

7. A probe card, comprising:

a space transformer having a probe connection pad electrically connected to each of a plurality of probes; and a probe head provided below the space transformer, and including a laminated anodic aluminum oxide structure in which a guide hole for allowing each of the probes is formed, wherein the laminated anodic aluminum oxide structure comprises:

a plurality of anodic aluminum oxide sheets; and a junction layer provided between the anodic aluminum oxide sheets to join the anodic aluminum oxide sheets to each other, and wherein an uppermost anodic aluminum oxide sheet of the anodic aluminum oxide sheets comprises a first barrier layer, and a lowermost anodic aluminum oxide sheet of the anodic aluminum oxide sheets comprises a second barrier layer, and wherein an upper surface of the laminated anodic aluminum oxide structure is configured as the first barrier layer, and a lower surface of the laminated anodic aluminum oxide structure is configured as the second barrier layer.

* * * * *